United States Patent

Tavazzani et al.

[11] Patent Number: 5,568,342
[45] Date of Patent: Oct. 22, 1996

[54] APPARATUS AND METHOD FOR PROTECTING AN AMPLIFIER CIRCUIT

[75] Inventors: Claudio Tavazzani, Pavia; Andrea Fassina, Milan; Fabrizio Stefani, Cardano, all of Italy

[73] Assignee: SGS-Thomson Microelectronics S.r.l., Agrate Brianza, Italy

[21] Appl. No.: 366,214

[22] Filed: Dec. 29, 1994

[30] Foreign Application Priority Data

Dec. 31, 1993 [EP] European Pat. Off. ............. 93830541

[51] Int. Cl.⁶ .................................................. H02H 3/04
[52] U.S. Cl. ..................... 361/18; 361/75; 361/94; 330/298
[58] Field of Search ............................. 361/18, 78, 86, 361/87, 75, 94; 330/298, 207 P

[56] References Cited

U.S. PATENT DOCUMENTS

| | | | |
|---|---|---|---|
| 4,319,197 | 3/1982 | Trummer | 330/11 |
| 4,441,136 | 4/1984 | Hampshire | 361/18 |
| 4,878,034 | 10/1989 | Gross et al. | 330/298 |
| 4,979,066 | 12/1990 | Kawata et al. | 361/10 |
| 5,138,516 | 8/1992 | Chapman | 361/18 |

FOREIGN PATENT DOCUMENTS

| | | | |
|---|---|---|---|
| 0572755A1 | 12/1993 | European Pat. Off. | H02H 11/00 |
| 61-227410 | 10/1986 | Japan | H03F 1/52 |
| 1129515 | 5/1989 | Japan | H03F 1/52 |
| 2157104 | 10/1985 | United Kingdom | G08B 1/08 |

*Primary Examiner*—Todd DeBoer
*Attorney, Agent, or Firm*—Seed and Berry LLP; David V. Carlson; Porta, Checcacci & Botti

[57] ABSTRACT

Circuit for protection of an amplifier stage comprising circuit switching means for turn-off of the stage and piloted through a logic gate OR by a monostable, which generates upon arise of abnormal operating conditions turn-off command signals having a predetermined duration.

A sensing circuit upon persistence of abnormal conditions at start-up or during normal operation also sends turn-off signals through the logic gate OR after enablement through a gate AND.

The signals of any enablement at the logic gate AND arrive through a logic gate OR from a window comparator coupled with stage start-up members, from the monostable, and from the output of said logic gate AND as a confirmation signal.

14 Claims, 5 Drawing Sheets

5,568,342

APPARATUS AND METHOD FOR PROTECTING AN AMPLIFIER CIRCUIT

TECHNICAL FIELD

The present invention relates to power amplifier protection devices and in particular to a monolithically integrable protection circuit for the final stage of an audio amplifier.

BACKGROUND

In power audio amplifiers (provided in either a monolithic or discrete form), the presence of devices for protection against abnormal or dangerous operating conditions for the amplifier, such as, for example, excessive output current or temperature, is important.

An existing method of providing such protection includes automatically turning off circuit portions subject to damage as soon as the abnormal condition is detected. It is therefore necessary to equip the amplifier with a circuit that enables it to operate again when the dangerous condition ceases or is removed. Such an enable circuit removes the need for the direct intervention by the user to turn off and restart the amplifier.

It is becoming ever more common to also equip audio amplifiers with protection that acts during the start-up phase. Indeed, this phase is potentially critical for the amplifier because the partial polarization of the final stages, typical of the start-up transition, can make ineffective the standard protection, but nevertheless be dangerous for the amplifier.

This additional protection device checks the presence of any critical conditions before the final stages begin to be polarized in order to timely stop the start-up sequence if necessary.

FIG. 1 shows a block diagram of an existing protection circuit that meets the requirements set forth above and is commonly used to protect the final amplifier outputs stage of audio power amplifiers.

Through a type OR logic gate circuit F, circuit switching means G for turn-off of the stage is controlled by three distinct lines.

If by trigger circuit means designed to detect abnormal operating conditions, there is detected, for example during normal operation, an overcurrent in the output elements of the amplifier stage, there is generated a so-called trigger pulse that controls, directly through the logic gate F, the circuit means G for turn-off of the stage.

The same pulse is coupled to the input terminal S of a bistable, or flip-flop, circuit L.

The output Q of the flip-flop L also enables a sensing circuit B designed to detect the persistence of abnormal operating conditions to control or instruct through the logic gate F the circuit switching means G to keep the stage turned off.

The input terminal R, through which the flip-flop L is returned to the initial stable state, which is that of normal operating conditions, is connected to the output terminal of a logic gate circuit D of the AND type. Through this AND logic gate D, the flip-flop L can receive either a pulse which is the inverse of the trigger pulse or a signal generated by the sensing circuit B in phase opposition to that with which the sensing circuit B controls the circuit switching means G. Through the AND logic gate D and the flip-flop L, the sensing circuit B is disabled for keeping the stage turned off when persistence of the abnormal operating conditions ceases.

All the signals used to activate or deactivate the circuit elements just indicated are determined on the basis of the characteristics of the integrated circuit in which the protection device is included and the supply levels provided for the final stage.

Again through the type OR logic gate F, turn-off of the stage can be determined also by a second sensing circuit, indicated by E, which is enabled to detect the persistence of abnormal conditions only in the amplifier turn-on phase.

Suppose that the initial turn-on phase, which due to the presence of the active components cannot occur instantaneously, is determined by the application of a positive voltage step to the network RC of an interface of the so-called amplifier stand-by. The rising voltage across capacitor C1 is detected by a comparator A of the two-threshold, i.e., the so-called window type.

Comparator A enables the second sensing circuit E only when the voltage across C1 is between a lower voltage threshold and an upper voltage threshold.

The upper voltage threshold of this voltage window is chosen at a voltage level lower than that at which the amplifier is turned on, to permit the sensing circuit E to complete the checks before the amplifier is capable of operating.

In other existing amplifiers, the various circuit blocks of FIG. 1 are implemented in different manners that are known in the art.

When the amplifier has several output channels, there must be a pair of sensing circuits provided for each channel: one, B, for protection during normal operation, and one, E, for protection during turn-on.

SUMMARY OF THE INVENTION

In accordance with one aspect of the present invention, a circuit is provided for protecting a stage of an amplifier during abnormal start-up or abnormal operating conditions. A first circuit generates an enable signal in response to either a start-up signal or a warning signal. The start-up signal is typically generated during a predetermined portion of a start-up phase of the amplifier. The warning signal is typically generated during one or more abnormal operating conditions, such as a short circuit. A fault block generates a fault signal in response to the enable signal during a fault condition. A second circuit generates a power-down signal to power down the stage in response to either the fault signal or the warning signal.

In another aspect of the invention, a monostable circuit generates the warning signal from substantially the beginning of the first or a second fault condition to a predetermined time after the end of the first or the second fault condition respectively.

An advantage provided by one aspect of the present invention is a reduction in the total number of circuit components and in particular of the sensing circuits, and thus an improvement in the reliability of protection and a reduction in the circuit integration area.

BRIEF DESCRIPTION OF THE DRAWINGS

The characteristics and advantages of a protection circuit in accordance with the present invention are set forth in the description below of embodiments thereof given by way of nonlimiting example.

DESCRIPTION OF THE INVENTION

A protection circuit for a final stage of a power amplifier (or more generally an amplifier stage) in accordance with the present invention is characterized by a circuit structure permitting the use of a single sensing circuit for each output channel instead of two distinct sensing circuits, as in existing amplifiers, whether for protection during normal operation or protection upon turn-on.

Figure 1:
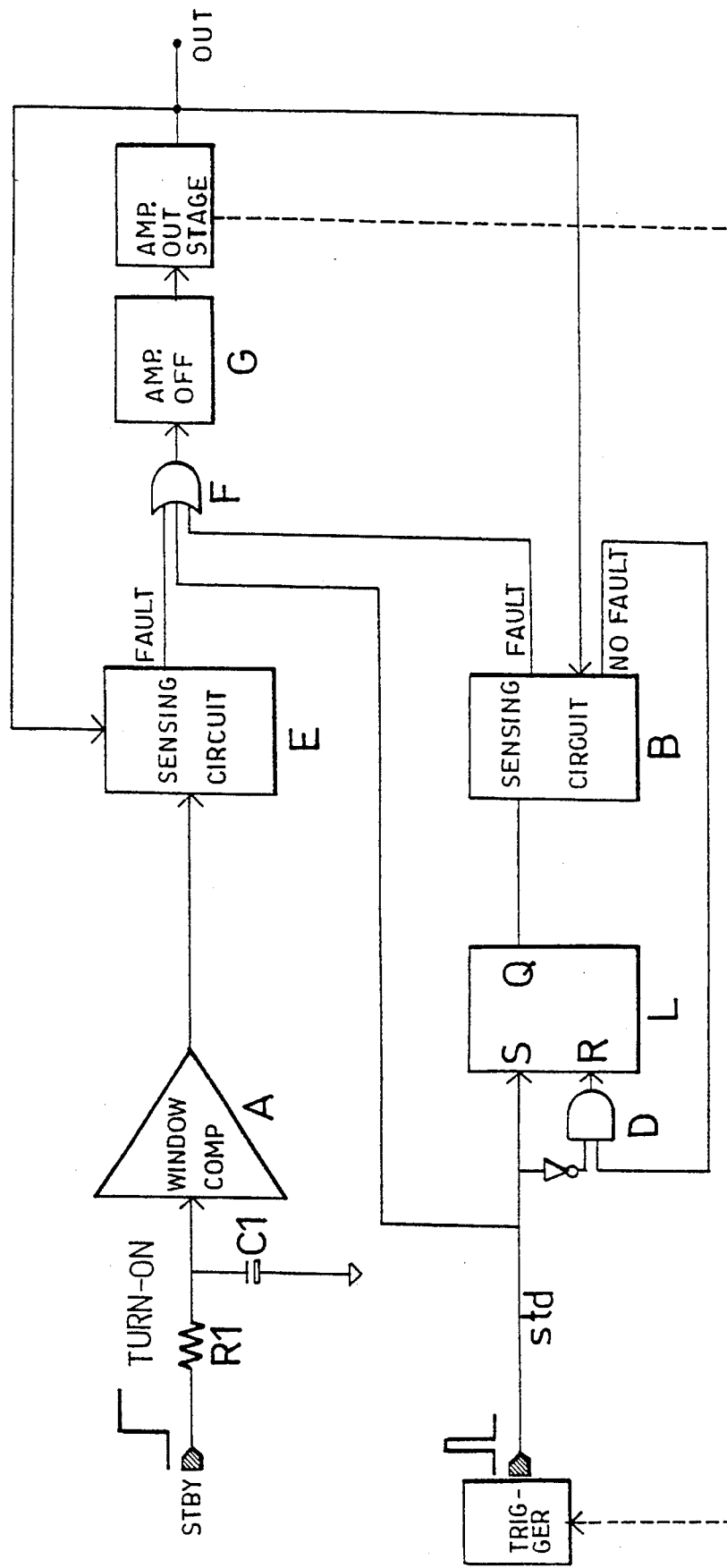
FIG. 1 shows a block diagram of an existing protection circuit for power amplifiers.
Figure 2:
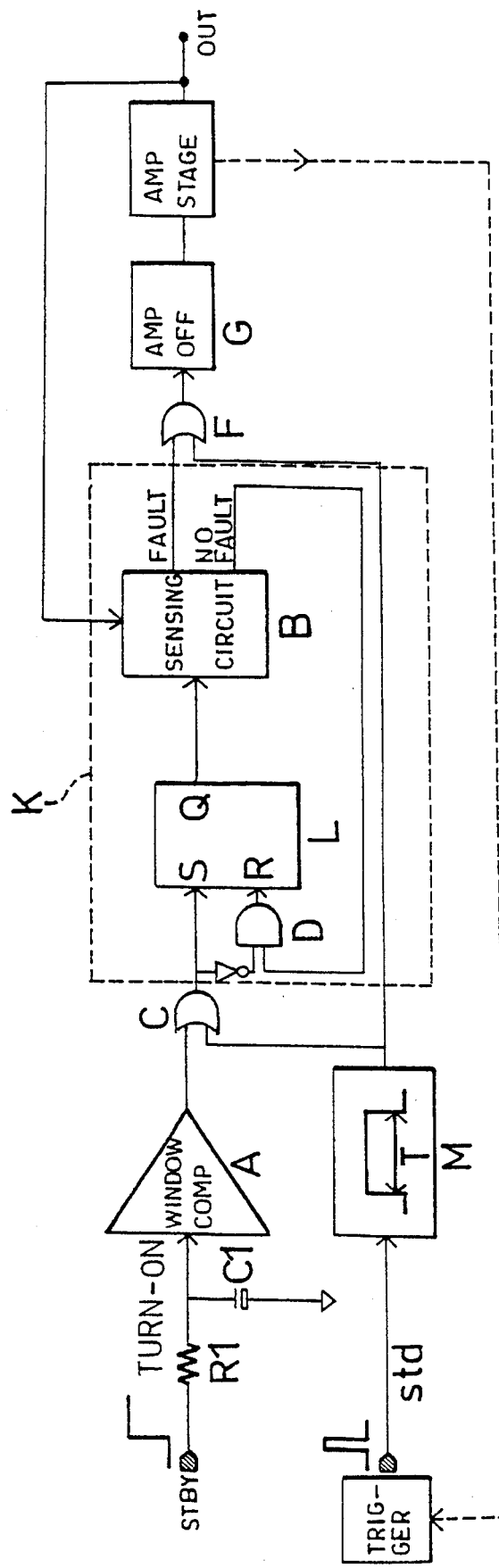
FIG. 2 shows a block diagram of an embodiment of a protection circuit in accordance with the present invention.

As in the known protection circuit of FIG. 1, in the circuits of FIGS. 1 and 2 there are provided circuit switching means G controlled through an OR gate F, to which, however, in accordance with the present invention, are coupled only two signal lines for turn-off of the amplifier stage.

Figure 3:
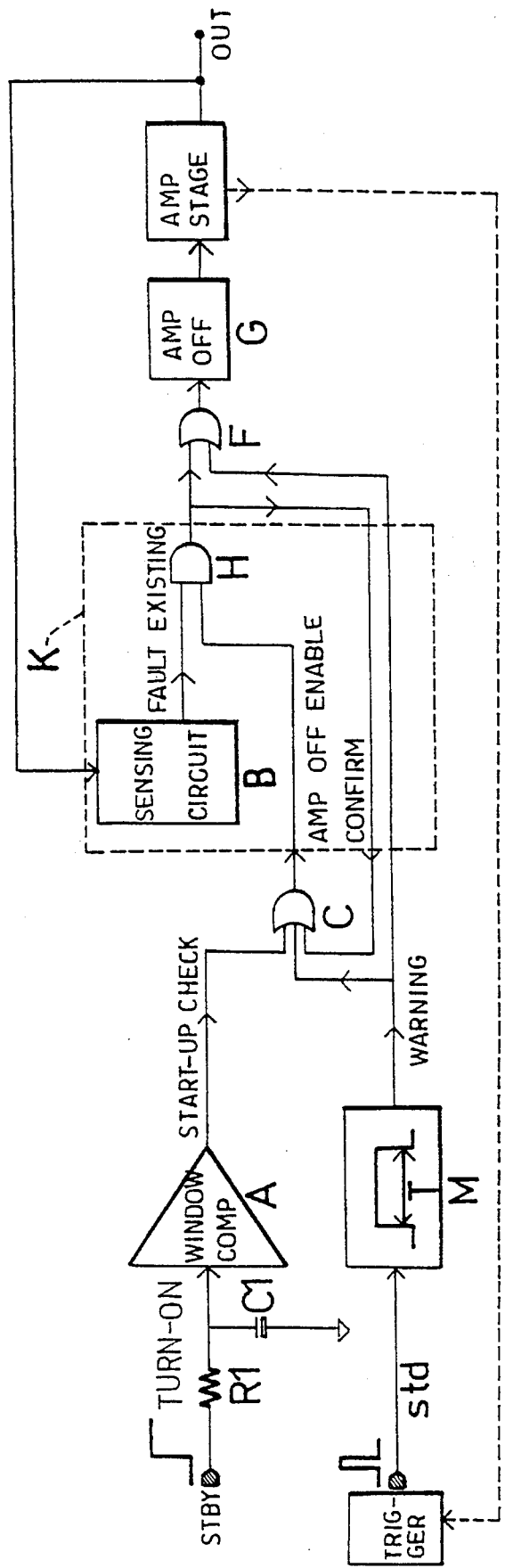
FIG. 3 shows a block diagram of another embodiment of a protection circuit in accordance with the present invention.

In both the block diagrams shown in FIGS. 2 and 3, there can be ideally identified a same circuit block K for turn-off and restoration of normal operating conditions of the stage provided however differently in the two diagrams.

This circuit block K comprises a single sensing circuit B, which in FIG. 2 is enabled by a flip-flop L to generate at its output a signal for turn-off of the stage; the configuration shown with inverter and logic gate D of the AND type connected to the terminal R is the same as that of the existing circuit shown in FIG. 1.

In the diagram shown in FIG. 3, the elimination of the flip-flop L is advantageously provided and the output signal of the sensing circuit B is operated on by means of a logic gate H of the AND type.

In both cases, the circuit block K as a whole is designed to detect any persistence of abnormal conditions at the output of the stage by means of at least one terminal (not shown) coupled with stage output elements (not shown) and to generate during said conditions signals that keep the stage turned off through the logic gate F by means of the circuit switching means G.

After termination of the abnormal conditions, the circuit block K ceases to generate turn-off signals, thus permitting automatic restart of the stage.

The circuit switching means G may be realized by electronic switches (not shown) which, when activated under abnormal operating conditions, switch to ground the current flows of the current generators (not shown) that feed the stage components. When, after removal of the abnormal conditions, the switches are deactivated, stage operation is automatically restored.

The circuit block K is enabled to generate turnoff signals by a logic gate C of the OR type, which has an input terminal connected to the output terminal of a double threshold comparator A, and a second input terminal connected to an output terminal of a generator M of command signals for turn-off of the stage.

It is important to note that in accordance with the aspect of the present invention shown in FIG. 3, to a third input terminal of the OR gate C is connected the output terminal of the AND gate H.

The generator M is activated by a TRIGGER pulse in a known manner. The command signals have a predetermined duration of time T starting from approximately the arise of the abnormal stage operation conditions.

The output terminal of the generator M is coupled to the circuit switching means G through the OR gate F. Generator M can comprise a monostable, i.e., "one shot," circuit that is well known in the art.

To explain in greater detail the operation of a protection circuit in accordance with the present invention, reference is now made to the block diagram shown in FIG. 3, examining the status of the signals at the various points of the protection circuit during the different phases.

As mentioned, the circuit B of the block diagram of FIG. 3 checks if there are abnormal conditions in amplifier operation, such as for example the persistence of a short circuit state of one or more amplifier outputs to ground or to supply, short circuit between two outputs, lack of load, and so on. The output line of block B, FAULT EXISTING, is high (i.e., 1 logic) if an abnormal condition occurs and is low (i.e., 0 logic) otherwise. The AND gate H enables the FAULT EXISTING signal to turn off the amplifier, thus placing it in a protected state, when the AMP OFF ENABLE signal is high, i.e. when at least one of the signals at the inputs of OR gate C, i.e., START-UP CHECK, WARNING, or CONFIRM, is high. These signals are in turn generated in response to the conditions set forth below.

The START-UP CHECK signal is generated during the start-up phase of the amplifier whereas the start-up command (typically a positive voltage step) is set by the user. The amplifier start-up command causes a gradual increase in the voltage across the capacitor C1.

As long as this voltage is between a lower and a higher threshold of the window comparator A, comparator A generates START-UP CHECK, which disappears when the voltage across C1 passes the upper threshold of the comparator A. As mentioned, the upper threshold of comparator A is placed at a lower level than that at which the amplifier starts in order to complete the checks during the starting phase before the amplifier is capable of operating.

The WARNING signal is generated by the monostable circuit M when an anomalous event, such as a short circuit current passing a given threshold, occurs. A TRIGGER pulse starts the monostable circuit M, which then generates the WARNING signal. The WARNING signal is a pulse that persists for the duration of the TRIGGER pulse plus a time T, which is determined internally by the monostable circuit M, and begins on the leading edge of the most recent TRIGGER pulse. That is, circuit M is triggered to generate WARNING by the leading edge of the trigger pulse, and to stop generating WARNING a time T after the trailing edge of TRIGGER. Typically, the duration of TRIGGER is substantially less than that of T. Thus, it can be said that WARNING is generated for a time T starting from substantially the beginning of the fault condition that causes the generation of TRIGGER.

It is important to discuss the differences between a circuit which generates the TRIGGER signal (not shown), and the sensing circuit B for persistence of abnormal conditions. When, for example, there occurs a short circuit during normal operation of the amplifier, a high current starts to run in the final power transistors and, upon passing a threshold of programmed values, a special circuit generates the TRIGGER signal, which the circuit continues to generate while the current remains above the threshold. The TRIGGER signal, via the monostable circuit M, the OR gate F, and the circuit switching means G, turns off the amplifier and at the same time enables the circuit B to signal if the short circuit persists or has been removed. Only in the latter case the amplifier is enabled to start again.

The monostable circuit M ensures actual turn-off of the final power transistors, because they require a turn-off time equal to that needed for the discharge of the capacitances, parasitic or otherwise, associated with their power and control components. Thus, WARNING is set to a sufficient duration to allow such discharging to occur.

The circuit M ensures persistence of a turn-off signal by generating WARNING for a time T that is greater than that strictly necessary for complete turn-off, so as to eliminate the danger of reactions that would limit the current delivered without, however, reaching complete turn-off. The sensing circuit B thus serves to check if the abnormal condition that caused generation of the TRIGGER signal was removed or not. For maximum safety of the amplifier, this check takes place after the amplifier has been turned off.

The CONFIRM signal is generated after at least one of the two previous signals (START-UP CHECK or WARNING) has been generated and only if the sensing circuit B signals actual persistence of the abnormal condition. The CONFIRM signal allows the outlet of the sensing circuit B to continue to be enabled to keep the final stage off after disappearance of the transient signals START-UP CHECK and WARNING if the abnormal condition persists. Disappearance of START-UP CHECK and WARNING takes place respectively after the voltage across C1 has passed the upper threshold of the window comparator A and after a time T has elapsed from the trailing edge of the TRIGGER signal. In the absence of the CONFIRM signal line, which constitutes a sort of memory for the circuit in question, the amplifier would always restart, even with persistence of the abnormal conditions, upon the falling of START-UP CHECK and WARNING to inactive low levels.

As shown, the elimination of flip-flop L renders the circuit of FIG. 3 less complex than the still-advantageous circuit of FIG. 2.

In operation, during the starting phase and in the absence of abnormal conditions, the voltage level on the STAND-BY line rises, generating a START-UP CHECK signal as soon as the voltage across C1 passes the lower threshold of A. There is generated an AMP OFF ENABLE signal while the FAULT EXISTING signal is not generated because there are no abnormal conditions. Therefore, the circuit means G remain inactive, and the CONFIRM signal is not generated. When the voltage across C1 passes the upper threshold of A, START-UP CHECK and AMP OFF ENABLE go inactive, and the abnormal condition sensing circuit B is no longer enabled to supply signals for turning off the amplifier. Therefore, the start-up diagnostic phase terminates and the amplifier can be started.

If starting takes place in the presence of abnormal conditions that are subsequently removed, the voltage level on the stand-by line generates the START-UP CHECK signal as soon as the voltage across C1 passes the lower threshold of A. The AMP OFF ENABLE signal is generated and also a FAULT EXISTING signal is generated by circuit B because there are abnormal conditions. Therefore, the circuit means G are activated and begin to keep the amplifier turned off. A CONFIRM signal is also generated. When the voltage across C1 passes the upper threshold of A, the diagnostic circuit continues to prevent the amplifier from starting, thanks to the CONFIRM and FAULT EXISTING signals, even if the START-UP CHECK signal is no longer generated. When the abnormal condition is removed, the FAULT EXISTING signal is no longer generated, nor is the CONFIRM signal. The circuit switching means G then cease to operate and the amplifier is enabled to start.

Now let us consider the case of a short circuit during operation followed by removal thereof after a certain time.

Under normal operation conditions, the voltage level on the stand-by line is high, and the transient voltage across C1 is greater than the upper threshold of A. Therefore, the START-UP CHECK signal is not generated. Following, for example, a short circuit, a TRIGGER signal arrives at the input of the monostable circuit M.

On the rising edge of TRIGGER, the monostable circuit M is activated, raising the WARNING line, which remains high all the time the TRIGGER signal is present plus a certain time T following disappearance of the TRIGGER signal.

The WARNING signal first turns off the amplifier (via circuits F and G) and also raises the voltage level on the AMP OFF ENABLE line, thus permitting the gate H to transmit the FAULT EXISTING signal. If the condition that caused the trigger signal (or any other abnormal condition) remains present, the sensing circuit B raises the FAULT EXISTING line and consequently the CONFIRM line, and at the same time keeps the amplifier off via the circuit switching means G. After cessation of the WARNING signal following return of the monostable circuit M to a stable (inactive) condition, the CONFIRM signal continues to enable the sensing circuit B to keep the amplifier off. When the abnormal condition is removed, the FAULT EXISTING line falls together with the CONFIRM signal, and the circuit means G are disabled. The amplifier can thus restart.

Figure 4:
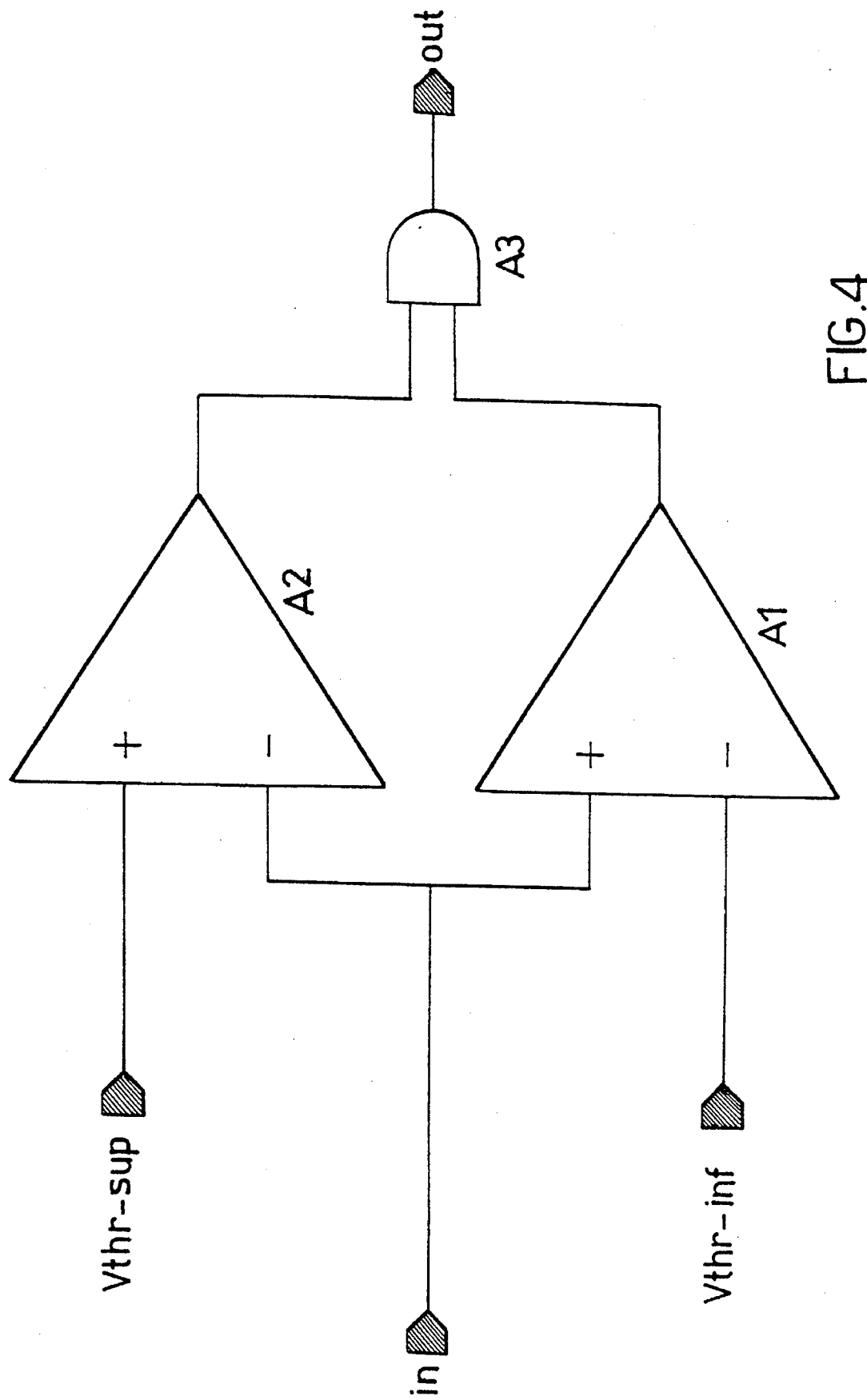
FIG. 4 shows a circuit diagram of one implementation of a double-threshold circuit, i.e., a window comparator, that is usable in a protection circuit in accordance with the present invention.

FIG. 4 is one embodiment of window comparator A of FIGS. 2 and 3. Window comparator A includes a first comparator A1, second comparator A2, and a logic gate A3, here an AND gate. Each comparator A1 and A2 has an inverting and noninverting input respectively indicated by the "−" and "+" signs. A lower voltage threshold Vthr-inf is input to the inverting terminal of A1. An upper threshold Vthr-sup is input to the noninverting terminal of A2. The input voltage is coupled to the noninverting terminal of A1 and the inverting terminal of A2.

As shown, when the input voltage is above the lower voltage threshold Vthr-inf and below the upper threshold Vthr-sup, the outputs of both comparators A1 and A2 are logic high, and thus the output signal from gate A3 is logic high, i.e., active. When the input voltage goes either below the lower threshold vthr-inf or above the upper threshold Vthr-sup, the output of A1 or A2 respectively is a logic zero, thus forcing the output signal to be zero. Thus, when used in the circuits of FIGS. 2 and 3, the STARTUP-CHECK signal is generated when the voltage input to window comparator A, i.e., the voltage across C1, is between the upper and lower thresholds Vthr-sup and Vthr-inf.

Figure 5:
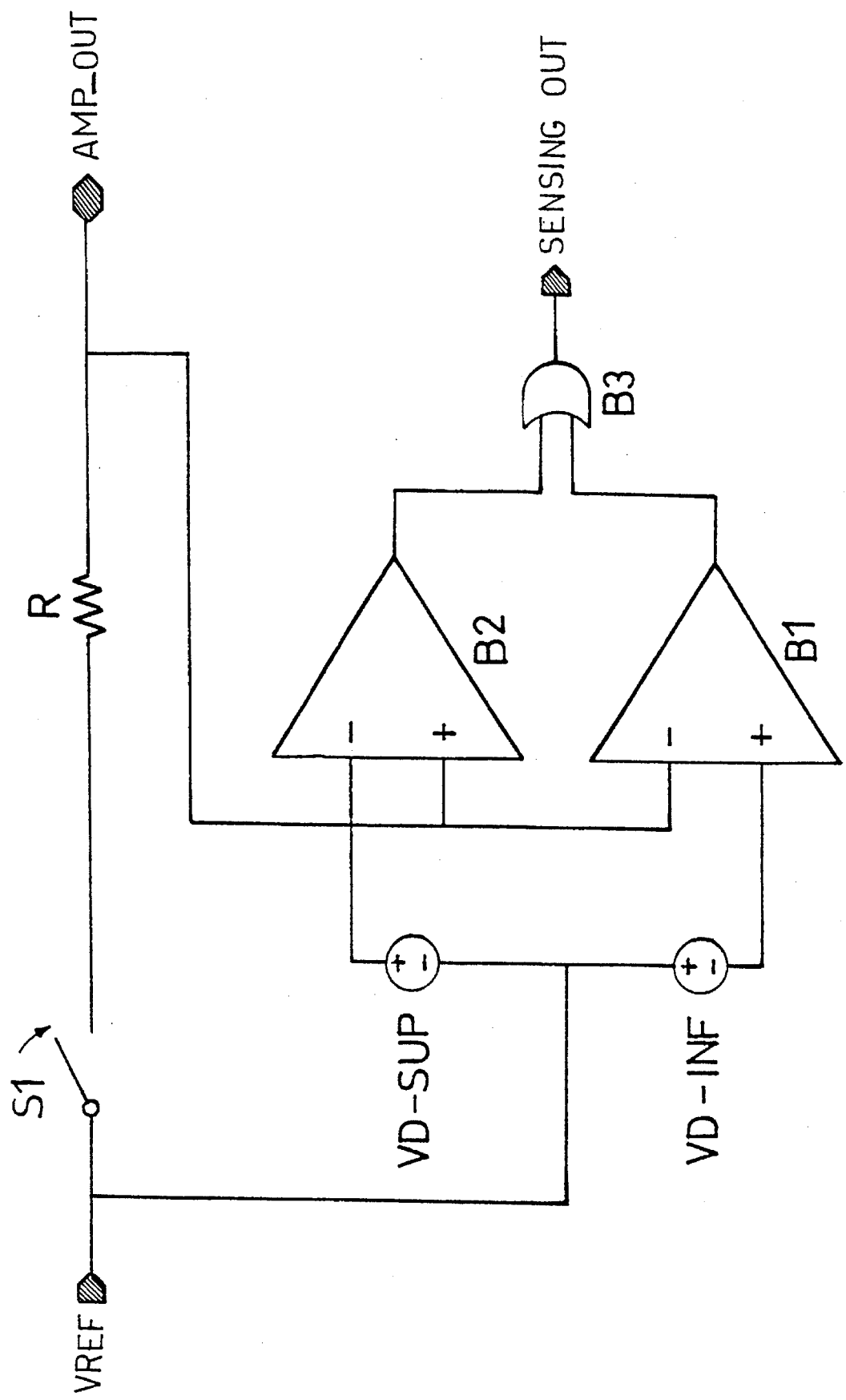
FIG. 5 shows a circuit diagram of a sensing circuit that is usable in a protection circuit in accordance with the present invention.

FIG. 5 is one embodiment of a sensing portion of sensing circuits B of FIGS. 2 and 3. As shown, sensing circuit B includes first and second comparators B1 and B2 arranged in a window comparator configuration and an OR gate B3. The upper and lower threshold voltages VD-SUP and VD-INF are provided at the noninverting and inverting terminals of B1 and B2 respectively.

In operation, when the signal AMP-OUT, which is a signal fed back from the output stage of the amplifier to indicate the condition of the output stage, is between VD-INF and VD-SUP, the outputs of both B1 and B2 are low as is the output of OR gate B3. Thus, a low at the SENSING OUT output indicates that there is no fault. When the voltage at terminal AMP-OUT goes either below VD-INF or above VD-SUP, the outputs of comparators B1 or B2 respectively goes to a logic high, forcing SENSING OUT to go logic high and indicate a fault condition.

In one aspect of the invention, a switch S1 is provided such that when closed, power is supplied from voltage VREF through a resistor R to provide power via the AMP-OUT terminal to the circuitry that feeds back the test signal to the AMP-OUT terminal.

In conclusion the invention permits utilization of a single sensing circuit B to detect any persistence of abnormal conditions during the starting and operating phases of an amplifier, with considerable saving of components, particularly for amplifiers having a large number of channels.

It is clear that modification, integration and replacement of elements in the embodiments described above by way of nonlimiting example may be made without departing from the spirit and scope of the invention.

We claim:

1. Circuit for protection of an amplifier stage comprising a double-threshold comparator having at least one input terminal connected to circuit elements for starting the stage and at least one output terminal, a circuit for generating command signals for turn-off of the stage which comprises a monostable circuit, activated by a pulse generated by trigger-type circuit means which detect the current level in output circuit elements of the stage and generating signals which have a predetermined length of time starting from arise of abnormal operating conditions in the stage, circuit switching means for turn-off of the stage and a circuit block for turn-off and restoration of normal stage operation conditions designed to detect any persistence of abnormal conditions at the stage output and generate during said conditions signals for turn-off of the stage, a command signal generator output terminal for turn-off of the stage and the output terminal of the double-threshold comparator being connected to an enablement terminal of the circuit block for turn-off and restoration through a first logic gate circuit of type OR, the command signal generator output terminal for turn-off of the stage and an output terminal of the turn-off and restoration circuit block being connected to a command terminal of the circuit switching means through a second logic gate circuit of type OR, said turn-off and restoration circuit block comprising a sensing circuit having at least one access terminal coupled with the output of the stage, an enablement terminal and at least one first output terminal and one second output terminal for output of signals in mutual phase opposition, the first output terminal of the sensing circuit being the output terminal of the turn-off and restoration circuit block, and a bistable circuit having at least one first input terminal and one second input terminal and an output terminal the first input terminal, which is the turn-off and restoration circuit block enablement terminal, being connected to the output terminal of the first logic gate circuit of type OR, which is also connected through an inverter and a logic gate circuit of AND type to the second input terminal of the bistable circuit, with said second input terminal, the second output terminal of the sensing circuit being connected through the logic gate circuit of AND type to said second input terminal of the bistable circuit.

2. Circuit for protection of an amplifier stage comprising a double-threshold comparator having at least one input terminal connected to circuit elements for starting the stage and at least one output terminal, a circuit for generating command signals for turn-off of the stage which comprises a monostable circuit, activated by a pulse generated by trigger-type circuit means which detect the current level in output circuit elements of the stage and generating signals which have a predetermined length of time starting from arise of abnormal operating conditions in the stage, circuit switching means for turn-off of the stage and a circuit block for turn-off and restoration of normal stage operation conditions designed to detect any persistence of abnormal conditions at the stage output and generate during said conditions signals for turn-off of the stage, a command signal generator output terminal for turn-off of the stage and the output terminal of the double-threshold comparator being connected to an enablement terminal of the circuit block for turn-off and restoration through a first logic gate circuit of type OR, the command signal generator output terminal for turn-off of the stage and an output terminal of the turn-off and restoration circuit block being connected to a command terminal of the circuit switching means through a second logic gate circuit of type OR, said turn-off and restoration circuit block comprising a sensing circuit having at least one input terminal coupled with the output of the stage and at least one output terminal and one logic gate circuit AND having at least one first input terminal connected to the output terminal of the sensing circuit, a second input terminal which is the turn-off and restoration circuit enablement terminal, and an output terminal which is the turn-off and restoration circuit output terminal, said turn-off and restoration circuit output terminal also being connected to the enablement terminal of the same turn-off and restoration circuit through the first logic gate circuit of type OR.

3. A device for protecting a stage of an amplifier, said stage having a control input terminal, an output terminal, and a fault-trigger terminal, said stage operable to generate on said fault-trigger terminal a fault-trigger signal during a fault condition, said device comprising:

a trigger circuit having a trigger input terminal coupled to said fault-trigger terminal and having a trigger output terminal, said trigger circuit operable to generate on said trigger output terminal a trigger signal in response to said fault-trigger signal;

a monostable circuit having an input terminal coupled to said trigger output terminal and having an output terminal, said monostable circuit operable to generate on said output terminal and in response to said trigger signal a warning signal having a predetermined duration;

a first circuit having a first input terminal coupled to receive a start-up signal, a second input terminal coupled to said output terminal of said monostable circuit, and a first-circuit output terminal, said first circuit operable to generate on said first-circuit output terminal and in response to either said start-up signal or said warning signal an enable signal;

a fault circuit block having an input terminal coupled to said output terminal of said first circuit, a fault-detect terminal coupled to said output terminal of said stage, and a fault-circuit output terminal, said fault circuit block operable to monitor said output terminal of said stage and to generate on said fault-circuit output terminal a fault signal during a fault condition of said stage; and a second circuit having a first input terminal coupled to said fault-circuit output terminal, a second input terminal coupled to said output terminal of said monostable circuit, and a second-circuit output terminal coupled to said control input terminal of said stage, said second circuit operable to generate on said second-circuit output terminal and in response to either said fault signal or said warning signal a power-down signal that shuts down said stage.

4. The device of claim 3, wherein said first and second circuits each comprise an OR gate.

5. The device of claim 3, further comprising a window comparator having an output terminal coupled to said input terminal of said first circuit and operable to generate said start-up signal.

6. The device of claim 3, wherein said second circuit comprises:

an OR gate having first and second input terminals coupled to said first and second input terminals of said second circuit respectively and having an output terminal; and an amplifier-off circuit having an input terminal coupled to said output terminal of said OR gate and having an output terminal coupled to said second-circuit output terminal.

7. The device of claim 3, wherein said fault circuit block comprises:

a sensing circuit having an input terminal, a detect terminal coupled to said fault-detect terminal, a fault output terminal coupled to said fault-circuit output terminal, and a no-fault output terminal, said sensing circuit operable to generate said fault signal on said fault output terminal during a fault condition of said stage, and to generate a no-fault signal on said no-fault output terminal during an operating condition of said stage;

a bistable circuit having a set input terminal coupled to said input terminal of said fault circuit block, a reset terminal, and an output terminal coupled to said input terminal of said sensing circuit; and a third circuit having first and second input terminals coupled to said input terminal of said fault circuit block and to said no-fault output terminal respectively, and having a third-circuit output terminal coupled to said reset terminal, said third circuit operable to generate on said third-circuit output terminal and in response to said no-fault signal and an absence of said enable signal a reset signal.

8. The device of claim 7, wherein said third circuit comprises:

an AND gate having a first input terminal, a second input terminal coupled to said second input terminal of said third circuit, and an output terminal coupled to said third-circuit output terminal; and an inverter having an input terminal coupled to said first input terminal of said third circuit and having an output terminal coupled to said first input terminal of said AND gate.

9. The device of claim 8 wherein said third circuit comprises an AND gate having first and second input terminals coupled to said first and second input terminals of said third circuit respectively, and having an output terminal coupled to said third-circuit output terminal.

10. The device of claim 3 wherein:

said first circuit includes a third input terminal coupled to said fault-circuit output terminal; and said fault circuit block includes, a sensing circuit having a detect terminal coupled to said fault-detect terminal and having a fault output terminal, said sensing circuit operable to generate a fault-existing signal on said fault output terminal during a fault condition of said stage, and a third circuit having first and second input terminals coupled to said fault output terminal and said input terminal of said fault circuit block respectively, and having a third-circuit output terminal coupled to said fault-circuit output terminal, said third circuit operable to generate on said third-circuit output terminal and in response to said fault-existing signal and said enable signal said fault signal.

11. A method for protecting a stage of an amplifier, comprising:

detecting during operation of said stage a fault condition having a duration;

generating in response to said fault condition and for a predetermined time a warning signal;

generating a fault signal for at least said duration; and powering down said stage until both said warning signal and said fault signal are no longer generated.

12. The method of claim 11, wherein said generating a warning signal comprises generating said warning signal for said predetermined time beginning substantially upon said detecting said fault condition.

13. The method of claim 11, further comprising:

generating a trigger pulse having a leading edge substantially upon said detecting said fault condition; and generating said warning signal substantially from said leading edge.

14. The method of claim 11 wherein said predetermined time of said warning signal is sufficient for said stage to completely power down.

* * * * *